US012663448B2

(12) United States Patent
King et al.

(10) Patent No.:  US 12,663,448 B2
(45) Date of Patent:  Jun. 23, 2026

(54) VOLTAGE PHASE DETECTION FOR A LAUNDRY APPLIANCE

(71) Applicant: Electrolux Appliances Aktiebolag, Stockholm (SE)

(72) Inventors: Brandon King, Charlotte, NC (US); Pavan Honnegowda, Charlotte, NC (US); Sunghoon Kim, Charlotte, NC (US); Philipp Kratzsch, Charlotte, NC (US)

(73) Assignee: ELECTROLUX APPLIANCES AKTIEBOLAG, Stockholm (SE)

( * ) Notice: Subject to any disclaimer, the term of this patent is extended or adjusted under 35 U.S.C. 154(b) by 911 days.

(21) Appl. No.: 17/948,436

(22) Filed: Sep. 20, 2022

(65) Prior Publication Data

US 2024/0094268 A1   Mar. 21, 2024

(51) Int. Cl.
G01R 19/25       (2006.01)
D06F 34/10       (2020.01)
(Continued)

(52) U.S. Cl.
CPC ......... G01R 19/2513 (2013.01); D06F 34/10 (2020.02); D06F 34/14 (2020.02);
(Continued)

(58) Field of Classification Search
CPC .......... D06F 46/10; D06F 58/38; D06F 34/14; D06F 58/26; D06F 2103/44; D06F 2105/28; G01R 19/2513
(Continued)

(56) References Cited

U.S. PATENT DOCUMENTS 4,481,786 A    11/1984  Bashark
5,006,778 A     4/1991  Bashark
(Continued)

FOREIGN PATENT DOCUMENTS

CA         2539139 A1 * 10/2006  ............. D06F 58/38
CN     106661816 A * 5/2017  ............. D06F 58/38
(Continued)

OTHER PUBLICATIONS

Birbir, Y., "A Digital Speed Control Application on the Universal Motor with PIC Microcontroller", Proceedings of the 6th WSEAS/ IASME Int. Conf. on Electric Power Systems, High Voltages, Electric Machines, Tenerife, Spain, Dec. 16-18, 2006, pp. 126-133.

*Primary Examiner* — Stephen M Gravini
(74) *Attorney, Agent, or Firm* — Chrisman Gallo Tochtrop LLC

(57) ABSTRACT

A laundry machine comprising: a drum; a motor to rotate the drum; electric heating element(s) configured to produce heat; an airflow path from the heating element(s) to the drum; an analog to digital converter (ADC) configured to sample an AC voltage from a first power line of a group of power lines connected to the machine; and a controller configured to: (a) trigger the ADC to sample an AC voltage from the first power line, (b) determine a timing of occurrence of a peak value of the sampled AC voltage from the first power line, (c) compare the timing of occurrence of the peak value to predetermined timing signatures, (d) choose one of the timing signatures based on the comparison, and (e) control power to the electric heating element based on the chosen timing signature. Methods of operating a laundry washing machine are also provided.

28 Claims, 5 Drawing Sheets

(51) Int. Cl.

| | | |
|---|---|---|
| *D06F 34/14* | (2020.01) | |
| *D06F 58/26* | (2006.01) | |
| *D06F 58/38* | (2020.01) | |
| *D06F 103/44* | (2020.01) | |
| *D06F 105/28* | (2020.01) | |

(52) U.S. Cl.
CPC .............. *D06F 58/26* (2013.01); *D06F 58/38* (2020.02); *D06F 2103/44* (2020.02); *D06F 2105/28* (2020.02)

(58) Field of Classification Search
USPC ........................................................ 34/499
See application file for complete search history.

(56) References Cited

U.S. PATENT DOCUMENTS

| | | | | |
|---|---|---|---|---|
| 5,101,575 | A * | 4/1992 | Bashark ............. | G01R 31/2825 34/562 |
| 5,130,624 | A | 7/1992 | Bashark | |
| 5,281,956 | A | 1/1994 | Bashark | |
| 5,578,928 | A | 11/1996 | Langan | |
| 5,640,113 | A | 6/1997 | Hu | |
| 5,761,828 | A * | 6/1998 | Larson .................. | D06F 58/263 34/539 |
| 6,271,506 | B1 | 8/2001 | Glaser | |
| 6,281,658 | B1 | 8/2001 | Han et al. | |
| 6,841,761 | B1 | 1/2005 | Banzato et al. | |
| 6,995,965 | B2 * | 2/2006 | Hameed .................. | D06F 58/50 361/91.1 |
| 7,005,618 | B2 * | 2/2006 | Riddle .................... | D06F 58/38 219/490 |
| 7,292,004 | B2 | 11/2007 | Ueda et al. | |
| 7,365,506 | B2 | 4/2008 | Yamamoto et al. | |
| 8,441,248 | B2 | 5/2013 | Kachorek et al. | |
| 8,924,604 | B2 | 12/2014 | Yogeeswaran et al. | |
| 9,027,258 | B2 | 5/2015 | Bellinger et al. | |
| 9,356,542 | B2 * | 5/2016 | Ragogna ................. | D06F 58/36 |
| 9,476,935 | B2 | 10/2016 | Kabler et al. | |
| 9,581,626 | B2 | 2/2017 | Schwind | |
| 9,679,728 | B2 | 6/2017 | Oosterwal et al. | |
| 9,899,945 | B2 | 2/2018 | Jang et al. | |
| 9,973,131 | B2 | 5/2018 | Lee et al. | |
| 10,184,208 | B2 * | 1/2019 | Rizzi ...................... | D06F 58/38 |
| 10,396,557 | B2 | 8/2019 | Gary | |
| 10,998,726 | B2 | 5/2021 | Gary | |
| 11,851,806 | B2 * | 12/2023 | Leibman ................. | D06F 58/04 |
| 11,946,960 | B2 * | 4/2024 | Della Schiava ... | H01R 13/6683 |
| 12,163,272 | B2 * | 12/2024 | Choe ........................ | D06F 58/38 |
| 12,168,849 | B2 * | 12/2024 | Welch ..................... | D06F 58/24 |
| 12,244,249 | B1 * | 3/2025 | Lin ........................ | H02P 25/062 |
| 2007/0170171 | A1 | 7/2007 | Shah et al. | |
| 2011/0210712 | A1 | 9/2011 | Tagare | |
| 2012/0098521 | A1 | 4/2012 | Kachorek et al. | |
| 2015/0322616 | A1 | 11/2015 | Ben et al. | |
| 2019/0330792 | A1 | 10/2019 | Del Maschio et al. | |
| 2021/0249861 | A1 | 8/2021 | Gary | |
| 2024/0094268 | A1 * | 3/2024 | King ....................... | D06F 58/38 |
| 2024/0373520 | A1 * | 11/2024 | Rizzo .................... | H05B 6/664 |

FOREIGN PATENT DOCUMENTS

| | | | | |
|---|---|---|---|---|
| EP | 0436374 | A2 | 7/1991 | |
| EP | 2977503 | A1 * | 1/2016 | ............. D06F 58/38 |
| EP | 3175761 | B1 | 8/2018 | |
| JP | 6605836 | B2 | 11/2019 | |
| WO | 2007107217 | A1 | 9/2007 | |
| WO | WO-2016012228 | A1 * | 1/2016 | ............. D06F 58/38 |

* cited by examiner

Fig. 5

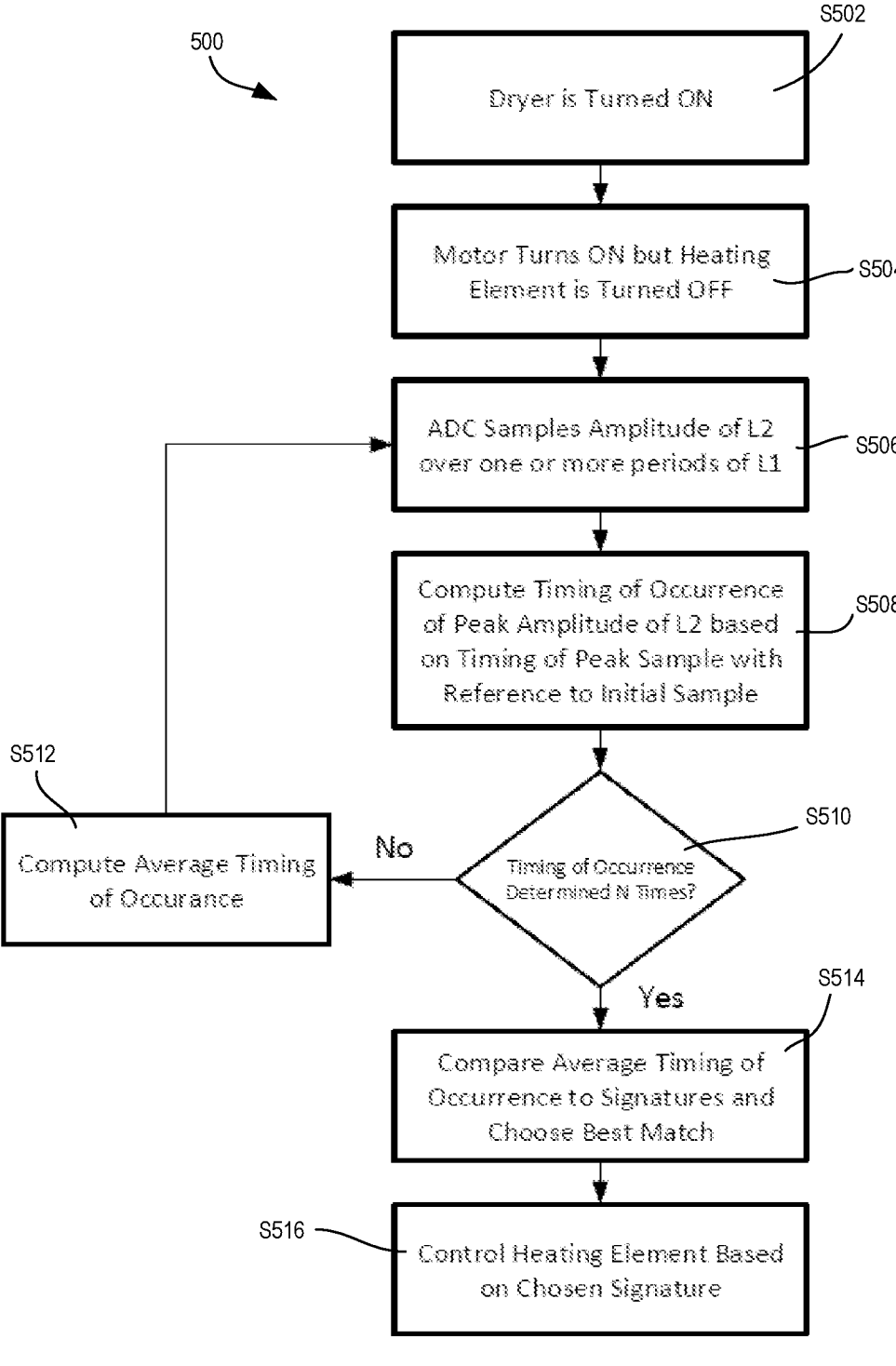

500

S502
Dryer is Turned ON

Motor Turns ON but Heating Element is Turned OFF
S504

ADC Samples Amplitude of L2 over one or more periods of L1
S506

Compute Timing of Occurrence of Peak Amplitude of L2 based on Timing of Peak Sample with Reference to Initial Sample
S508

Timing of Occurrence Determined N Times?
S510

No

S512
Compute Average Timing of Occurance

Yes

Compare Average Timing of Occurrence to Signatures and Choose Best Match
S514

S516
Control Heating Element Based on Chosen Signature

VOLTAGE PHASE DETECTION FOR A LAUNDRY APPLIANCE

FIELD

The present invention relates to systems and methods for detecting line voltage phase for a laundry appliance such as an electric clothes dryer.

BACKGROUND

Conventional laundry appliances such as electric clothes dryers use electromechanical relays to drive one or more electric heating elements to increase temperature within a rotating drum for drying clothes. The use of these electromechanical relays prevents conventional electric clothes dryers from achieving fine-grained control of the temperature within the drum which can lead to unnecessary power consumption and damage to the clothes being dried.

SUMMARY

In a first exemplary aspect, there is provided a laundry machine comprising: a drum configured to receive laundry; a motor configured to rotate the drum; at least one electric heating element configured to produce heat; an airflow path extending from the at least one electric heating element to the drum; an analog to digital converter (ADC) configured to sample an AC voltage from a first power line of a group of power lines electrically connected to the laundry machine; and a controller configured to: (a) trigger the ADC to sample an AC voltage from the first power line, (b) determine a timing of occurrence of a peak value of the sampled AC voltage from the first power line, (c) compare the timing of occurrence of the peak value to a plurality of predetermined timing signatures, (d) choose one of the predetermined timing signatures based on the comparison, and (e) control power to the electric heating element based on the chosen one of the predetermined timing signatures.

In another exemplary aspect, there is provided a method for operating a laundry machine comprising a drum configured to receive laundry, a motor configured to rotate the drum, at least one electric heating element configured to produce heat, an airflow path extending from the at least one electric heating element to the drum; and an analog to digital converter (ADC) configured to sample an AC voltage from a first power line of a group of power lines electrically connected to the laundry machine, and a controller, the method comprising: (a) sampling, by the controller, an AC voltage from the first power line, (b) determining, by the controller, a timing of occurrence of a peak value of the sampled AC voltage from the first power line, (c) comparing, by the controller, the timing of occurrence of the peak value to a plurality of predetermined timing signatures, (d) choosing, by the controller, one of the predetermined timing signatures based on the comparison, and (e) controlling, by the controller, power to the electric heating element based on the chosen one of the predetermined timing signatures.

Other exemplary aspects are provided in the appended claims, the following description, and the attached Figures.

BRIEF DESCRIPTION OF THE FIGURES

FIG. 5 is a flowchart of a line voltage detection method performed by the clothes dryer, according to an embodiment of the present invention.

DETAILED DESCRIPTION

The inventors have determined that improved control over heating in an appliance such as an electric clothes dryer can be achieved by using a device such as a TRIAC (triode for alternating current) to control the on and off operation of the heater. TRIACs offer more precise control, and, unlike relay switches, do not fatigue over time. However, while it has been proposed in the past to use TRIACs to control electric heaters, a problem lies in the fact that the line voltage phase to a dryer can vary depending on how the wiring is connected to the line. This variable prevents TRIACs from being used without there being a risk that the TRIAC will be improperly operated, leading to a fault condition, such as reduced heating performance or a fault condition that prevents the appliance from operating.

Aspects of the present invention provide a system and method for detecting line voltage phase for a laundry appliance such as an electric clothes dryer or a combination washer/dryer. Once line voltage phase is detected, a controller of the clothes dryer modulates power to the electric heating element by properly controlling the ON/OFF operation of electronic switches (e.g. TRIACs) at the zerocrossings of the line voltage.

Figure 1:
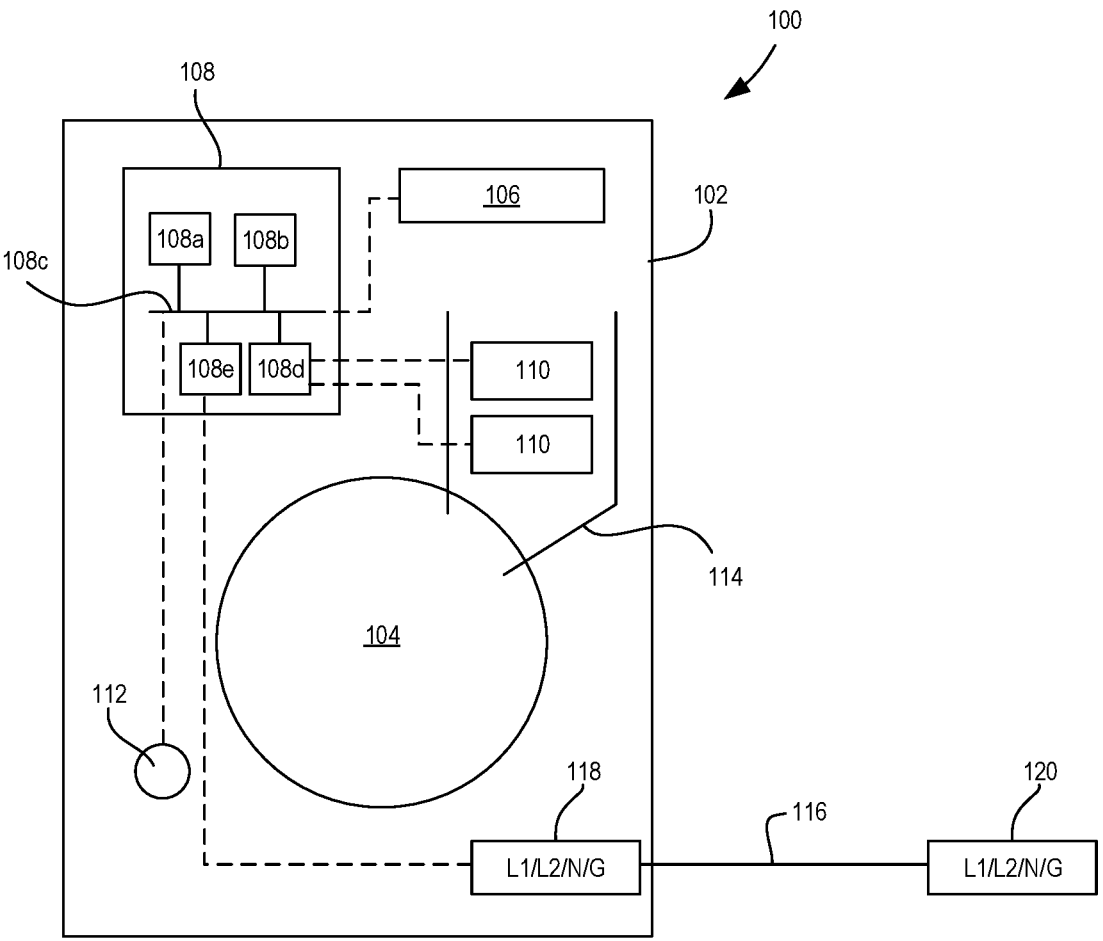
FIG. 1 is a simplified block diagram of a clothes dryer, according to an embodiment of the present invention.

FIG. 1 is a simplified block diagram of a clothes dryer 100. The clothes dryer 100 generally has a body 102 with a door (not shown) for inserting the clothes into a rotatable drum 104 and user interface ("I/O") 106 having one or more buttons, switches, displays, etc., for allowing the user to control the clothes dryer and receive feedback from the clothes dryer. Included within the clothes dryer 100 is a controller 108 (e.g. processor 108a, memory 108b, communication bus 108c, etc.) for controlling the operation of clothes dryer 100 based on stored and executed drying cycle programs selectable by the user via the user I/O 106. The controller 108 generally controls the clothes dryer 100 via one or more electronic switches 108d (e.g. TRIACs) for driving one or more electric heating elements 110 that generate heat during the drying cycle, sensors (e.g. temperature sensors) for detecting operational states of the dryer, one or more motors 112 for spinning the drum 104 during the drying cycle and other devices (e.g. fans, steam generators, etc.). The one or more heaters 110 are connected to the drum 104 by an airflow path 114 (e.g., ducts, vents, fans and the like), which may be open at each end, or a recirculation path.

Generally, during installation, a user (e.g. electrician) connects a power cord 116 to the power terminals 118 of the clothes dryer. The power terminals include line terminals L1/L2, a neutral terminal N, and a ground terminal G. Matching L1/L2, N and G line terminals are found in the power outlet 120 into which the power cord 116 is plugged. These power terminals provide power to support various electrical components within the clothes dryer 100. For example, lines L1/L2 provide voltages of different phases to the clothes dryer 100. When use in combination with each other, L1/L2 provide a large voltage (e.g. 208V, 240V, etc.) for use by high power consuming electrical components (e.g. electrical heating elements) within the clothes dryer 100, whereas when L1 or L2 are used in combination with the neutral terminal N, they provide a low voltage (e.g. 120V) for use by lower power consuming electrical components such as the controller 108, user I/O 106, motors, sensors, etc., often via a step-down transformer. It will be appreciated that specific voltage values (e.g., 240V) are nominal, and that power line fluctuations and other factors can occur to vary the total voltage somewhat in any given circumstance.

Electronic switches (e.g. TRIACs) 108*d* of the clothes dryer 100 are used to drive the high-voltage electronic components by these line voltages. For example, two TRI-ACS 108*d* may be used to control the supplies of L1 and L2 to two split high-power consuming electric heating elements 110. In other words, a first TRIAC T1 may electrically supply L1/L2 to a first electric heating element, whereas a second TRIAC T2 may electrically supply L1/L2 to a second electric heating element. When turned ON (e.g. when the TRIACs are in a conductive state), both T1 and T2 power the electric heating elements 110 with a high voltage (e.g. 208V, 240V, etc.). The electric heating elements 110 are resistive and therefore produce heat as the power is consumed. This heat is used to heat the air passing via the airflow path 114 through the drum 104 of the clothes dryer 100 for drying the clothes.

These electronic switches 108*d* may be modulated (e.g. turned ON/OFF) with respect to the cycles of the line voltage to provide fine-grained control over the power consumed by the electric heating elements 110. For example, to produce full heat (i.e., 100% heating capacity of the heating element), the controller can turn the TRIACs 108*d* ON until a desired drum temperature is reached, at which point the controller turns the TRIACs 108*d* OFF. However, fractional heat (e.g. 1%-99% heating capacity of a heating element 110 or combined capacity of multiple heating elements 110) may be beneficial in some scenarios where power consumption is of importance, or when delicate clothing items are being dried. To produce fractional heat (e.g. 50% heating capacity of the heating element), the controller 108 can alternately turn the TRIACs ON/OFF every N line cycles until a desired drum temperature is reached. Fractional heat essentially extends the dry time of the drying cycle by using low heat, in return for reducing power consumption and/or reducing potential heat damage to the clothes.

However, to safely produce fractional heat and avoid high-frequency noise spikes that could affect the operation of the electronic components within the dryer, as well as other electrical appliances attached to the same power line and around the dryer, the TRIACs should be switched ON/OFF at zero-crossings of the line cycles (e.g. points in time where L1/L2 cross zero volts). The controller 108 therefore needs to know the phase information for the electrical supply lines L1/L2 in order to predict the zero-crossings. Unfortunately, the phase shift between the electrical supply lines L1/L2 is not the same in every installation scenario. For example, most North American dryer installations use a split phase power supply, where 120V L1 and 120V L2 are shifted by 180° relative to one another to generate 240V for powering the clothes dryer. However, there are some installations that still a use a three-phase power supply where two of the three lines L1/L2/L3 are chosen. These chosen lines, however, are shifted by only 120° relative to one another to generate 208V for powering the clothes dryer. Depending on the two lines chosen (e.g. L1/L2 or L1/L3 or L2/L3) in the three-phase scenario, the supply may be 208V leading (e.g. L2 leads L1 in phase) or 208V lagging (e.g. L2 lags L1 in phase). Due to the different phase shifts inherent in the potential scenarios described above (e.g. 240V, 208V leading, and 208V lagging), the zero-crossings will be different and should be determined by the controller for proper TRIAC switching control.

Figure 2:
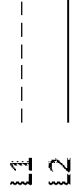
FIG. 2 is a partial waveform of 240V line voltage for powering the clothes dryer, according to an embodiment of the present invention.
Figure 2:
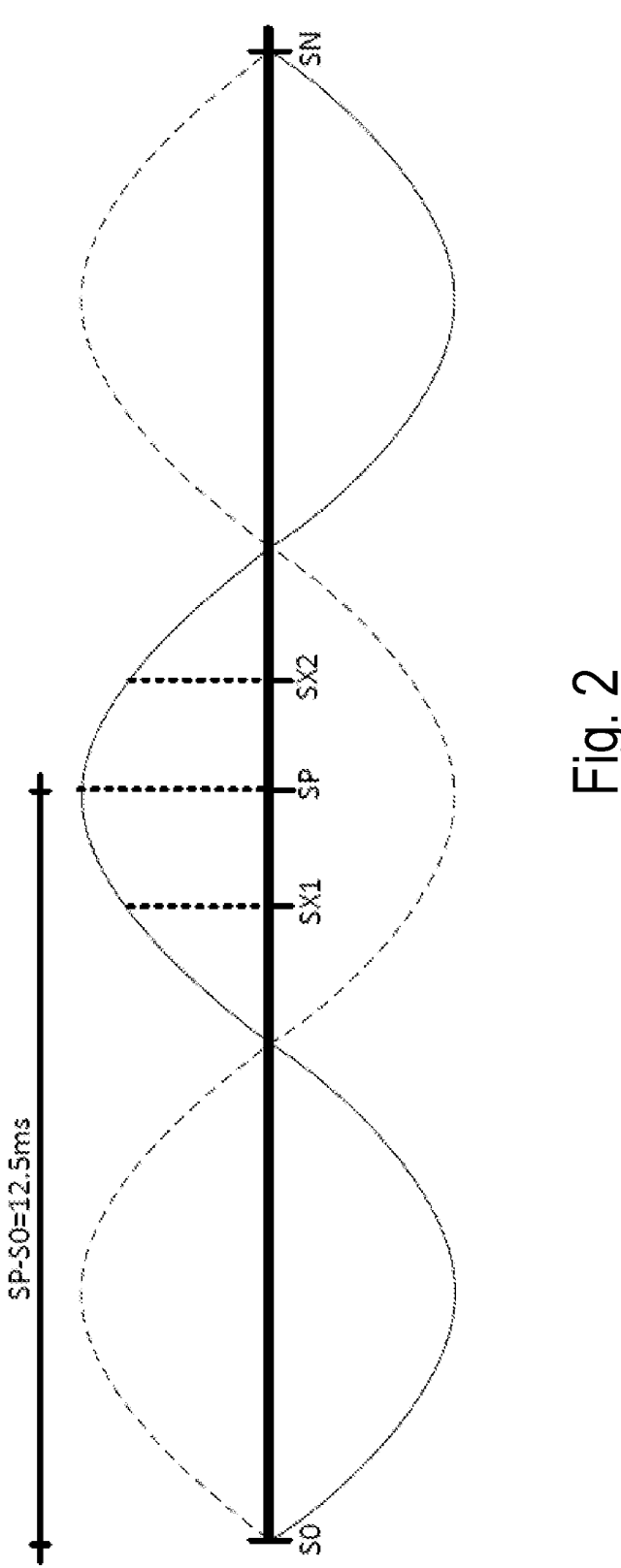
Figure 3:
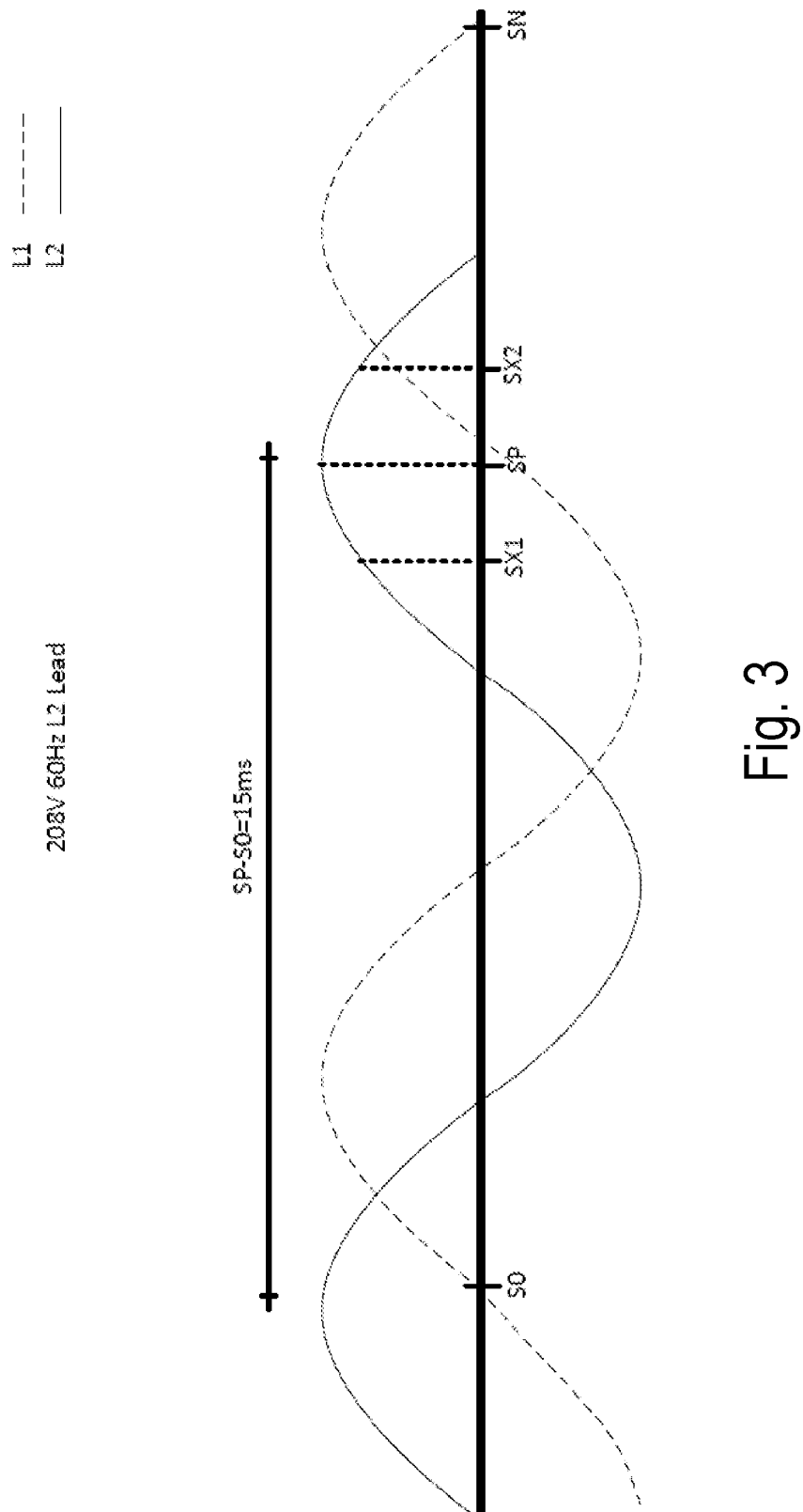
FIG. 3 is a partial waveform of 208V leading line voltage for powering the clothes dryer, according to an embodiment of the present invention.
Figure 4:
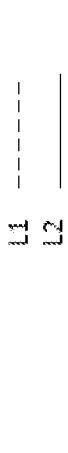
FIG. 4 is a partial waveform of 208V lagging line voltage for powering the clothes dryer, according to an embodiment of the present invention.
Figure 4:
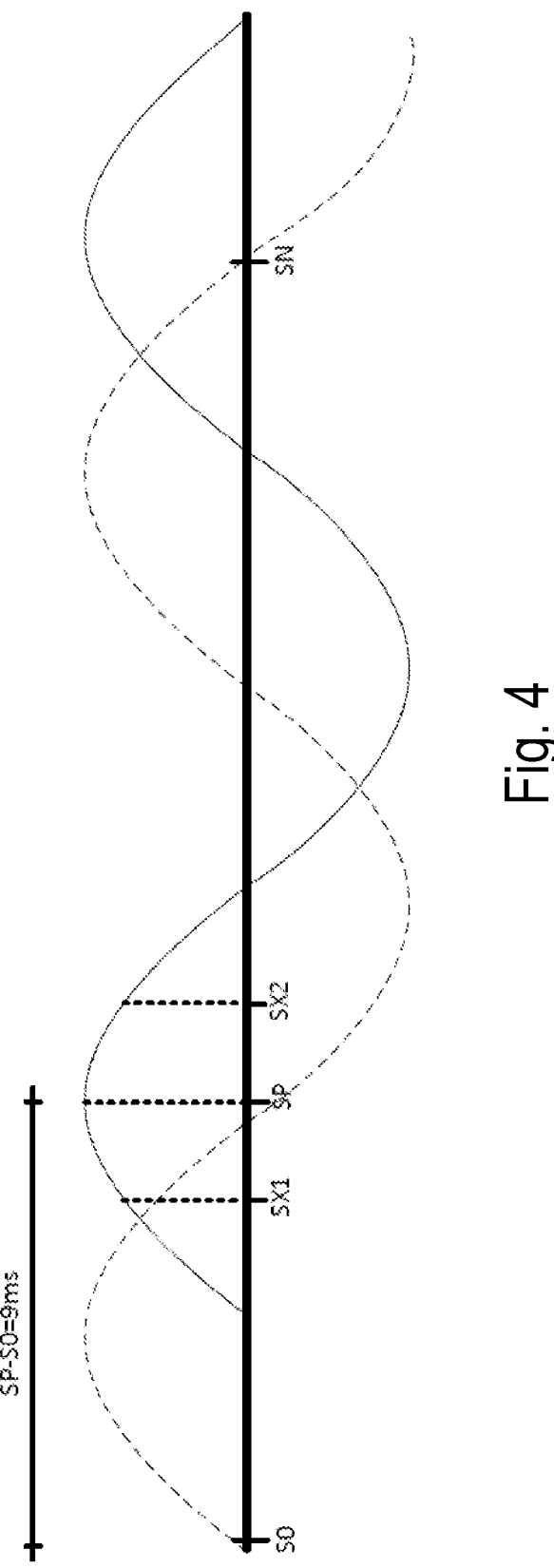

FIG. 2 is a partial waveform of 240V line voltage for powering the clothes dryer where L1 and L2 are 180° phase shifted with respect to one another. FIG. 3 is a partial waveform of 208V leading line voltage for powering the clothes dryer where L1 and L2 are 120° phase shifted with respect to one another and L2 leads L1. FIG. 4 is a partial waveform of 208V lagging line voltage for powering the clothes dryer where L1 and L2 are 120° phase shifted with respect to one another and L2 lags L1. In FIGS. 2, 3 and 4, L1 is shown as the dashed line and L2 is shown as the solid line.

As will be described in more detail in reference to FIG. 5, L2 is sampled by the controller to determine the peak value of L2. FIGS. 2, 3 and 4 show the samples where S0 represents a first sample of a sampling window, SN represents the last sample the sampling window, and SX1/SX2 represent boundary samples between which the peak value of L2 occurs at SP for the given sampling window. These samples of L2 are captured by an analog to digital converter (ADC) 108*e* of the controller 108 during a line voltage phase detection method for determining whether the line voltage is 240V, 208V leading, or 208V lagging. In general, during the line voltage phase detection method, the controller 108 triggers the ADC 108*e* at a zero-crossing of L1 to sample L2 for a given sampling window (e.g. sample L2 for 40 samples over 1.5 cycles of L1) and determine a peak value of L2. The time that this peak value occurs can be determined based on the sampling period and then used to determine whether the line voltage is 240V, 208V leading, or 208V lagging. For example, if the peak occurs at the $25^{th}$ sample, and the sampling period is 0.5 ms, then the controller knows that the peak occurred at 12.5 ms. This timing of 12.5 ms corresponds to the known peak timing of one of the three possible line voltage scenarios (e.g. 240V line voltage). In other words, the controller 108 knows the theoretical peak timing of each of the three possible line voltage scenarios, and compares the measured peak timing to the known timings to find a match. Once a match is found, the controller can then predict zero-crossings for the line voltage and use these predictions to control the TRIACs accordingly.

FIG. 5 is a flowchart of a line voltage detection method 500 performed by the clothes dryer. In step S500, the user turns the clothes dryer ON. For example, the user inserts the clothes into the drum, closes the door, sets a dry cycle and pushes the start button. In step S502, the controller turns ON the motor that spins the drum but does not yet turn ON the heating element (e.g. the controller attempts to perform line voltage detection prior to turning the heating element ON). In step S506, the controller uses the ADC to sample the amplitude of L2 over one or more periods of L1 (e.g. 1.5 periods of L1). For example, the controller starts the sampling of L2 at S0 (the zero-crossing of L1) and continues to sample L2 a number of times at a set sampling period until a final sample SN is captured (e.g. N=40 samples may be taken). After sampling is complete, in step S508 the controller computes a timing of occurrence of the peak value of L2 which occurs at SP between SX1 and SX2 as shown in FIGS. 2, 3 and 4. The peak value of L2 can be determined as the largest value captured at SP between SX1 and SX2. If the sampling period is X milliseconds and the peak occurs at the $Y^{th}$ sample, then the peak occurs at X*Y milliseconds.

Rather than making a single determination of the timing of occurrence of the peak value of L2, the controller can perform this determination N (e.g. 10) times. For example, in step S510, the controller may determine if the peak value determination has been made N times. If not, then the average timing of occurrence of the peak value of L2 is computed in step S512 and steps 1-4 are repeated. Each time through the loop, the average timing of occurrence of the peak value of L2 is updated. Once the determination has been made N times, the method moves on to step S514 where the controller compares the average timing of occurrence of the peak value of L2 to known timing signatures (e.g. known theoretical timing of occurrence of the peak value of L2) for the 240V, 208V leading and 208V lagging scenarios and chooses the best match. In other words, the controller chooses the timing signature that most closely matches the computed average timing of occurrence of the peak value of L2.

When the sampling period is X milliseconds and on average, the peak occurs at the $Y^{th}$ sample, the controller chooses the line voltage scenario with the peak time signature closest to the X*Y milliseconds. The timing of occurrence of the peak value of L2 is dependent on the frequency of L1/L2, the sampling frequency and the sampling window start timing. In a first scenario, if the sampling period is 0.5 ms and L1/L2 are 60 Hz signals, a timing of occurrence of the peak value of L2 of around 12.5 ms is classified as 240V. This is shown in FIG. 2 where the peak SP of L2 occurs at the first minimum of L1. In a second scenario, a timing of occurrence of the peak value of L2 of around 15 ms is classified as 208V leading. This is shown in FIG. 3 where the peak SP of L2 occurs just after the first minimum of L1. In a third scenario, timing of occurrence of the peak value of L2 of around 9 ms is classified as 208V lagging. This is shown in FIG. 4 where the peak SP of L2 occurs just before the first minimum of L1.

As an alternative, rather than computing the average timing of occurrence of the peak value of L2, the controller can choose the best match timing signature after each loop iteration and then determine which of the signatures was chosen the most times during the iterations. For example, if the line voltage is classified as 240V (8 out of 10) times over the 10 iterations, then the majority classification is determined to be 240V which is then chosen as the final decision.

Regardless of how the line voltage is classified, in step S516 the controller then uses the chosen classification in order to control the heating element. Specifically, if the controller classifies the line voltage as 240V, then the known zero-crossings for 240V can be used for switching the TRIACs ON/OFF. The same is true for the 208V leading/lagging classifications, in which case the respective zero crossings of L1 and L2 can be considered to determine the total power waveform (i.e., L1-L2) and operate the TRIACs accordingly. For example, the controller can power the heating element at fractional power by alternately turning the TRIACs ON/OFF at integer multiples of 12 ms when the classification is 240V, integer multiples of 15 ms when the classification is 208V leading, and integer multiples of 9 ms when the classification is 208V lagging.

Fractional power for providing fractional heat to the drum is beneficial for various reasons. For example, certain clothes may be delicate and could be damaged with high heat. Therefore, the user can select a delicate setting that uses only fractional power (e.g. 50% power) to dry these clothes at the possible expense of extended drying time. The result is that the clothes will be dried without damage. Other reasons for this type of partial power control could be for increased efficiency. For example, the user can select a power saving setting that uses only fractional power (e.g. 50% power) to dry the clothes at the expense of extended drying time. The result is that the clothes will be dried while reducing power consumption of the clothes dryer. Yet another reason for this type of partial power control could be for increased heating element life. For example, the user can select a machine life extending setting that uses only fractional power (e.g. 50% power) to dry the clothes. The result is that the clothes will be dried while reducing thermal stress on the heating element thereby increasing heating element life, etc.).

From this, it will be understood that the determination of the voltage classification can be used to adjust the actual power output of the heating element (or elements) to achieve the desired heat power target. The heat power output is a function of voltage V and heating element resistance R (i.e., $P=V^2/R$) (ignoring certain losses in the energy conversion process). The resistance R of the heating element is expected to remain essentially constant between particular drying machines of a single model, and so the controller can be programmed to use a single value for heating element resistance R. Using this assumption, the desired power output, particularly a fractional power output, can be achieved regardless of whether the voltage is determined to be 240V or 208V. This can be done by using lookup tables, formula calculations, and the like, in order to select the appropriate duty cycle to achieve the desired power output.

For example, using the 240V power supply as the baseline, a desired fractional power output of 50% can be achieved by operating the heating element at a 50% duty cycle if the voltage is classified as 240V. However, if the voltage is classified as 208V, then using the same 50% duty cycle will yield a lower heat power output according to the formula above ($P=V_2/R$, where R is constant). Thus, the duty cycle must be increased to achieve the same 50% actual power output. In this case, the prorated heat output to cause a 208V power supply to achieve the comparable heat output for a 240V power supply is calculated according to the formula $X=(V1^2/V2^2)$, wherein X is the proration value, V1 is the baseline voltage value (i.e., in this example, 240V) and V2 is the chosen voltage value. If the chosen voltage value is 240V, then the proration value is equal to 1. However, if the chosen voltage value is 208V, the proration value equals ~1.33. The proration value is a multiplier that is applied to the duty cycle to achieve the desired power output. In this case, the duty cycle for a 208V power supply must be increased by a factor of ~1.33 to achieve the same 50% fractional power output that would be achieved by a 240V power supply—i.e., the duty cycle would be –66%, rather than 50% (~1.33*50%).

The same formula can be used regardless of the baseline voltage or differences in voltages. It will also be understood that the proration value may be capped at a certain value. Specifically, it is not possible to operate the heating element at a duty cycle greater than 100%. Thus, if multiplying the fractional power output by the proration value would yield a number greater than 100%, the value 100% would be selected. In this case, the heating element operating at a lower voltage simply would not achieve the same heating capacity as it could when operated at a higher voltage.

As noted above, the proration value also may be determined based on lookup tables, logical selection, or the like. For example, in the case of a typical laundry machine operating in a country having only a limited number of possible supply voltage characteristics, like the United States, the controller may be programmed to simply apply a proration value of −1.33 upon classifying the supply voltage as 208V leading or lagging, and not apply a proration value (or apply a proration value of 1, which is essentially synonymous with not applying a proration value) upon classifying the supply voltage as 240V. Other alternatives and embodiments will be apparent to persons of ordinary skill in the art in view of the present disclosure.

Although the invention is illustrated and described herein with reference to specific embodiments, the invention is not intended to be limited to the details shown. Rather various modifications may be made in the details within the scope and range of equivalence of the claims and without departing from the invention.

The invention claimed is:

1. A laundry machine comprising:
a drum configured to receive laundry;
a motor configured to rotate the drum;
at least one electric heating element configured to produce heat;
an airflow path extending from the at least one electric heating element to the drum;
an analog to digital converter (ADC) configured to sample an AC voltage from a first power line of a group of power lines electrically connected to the laundry machine; and
a controller configured to:
(a) trigger the ADC to sample an AC voltage from the first power line,
(b) determine a timing of occurrence of a peak value of a sampled AC voltage from the first power line,
(c) compare the timing of occurrence of the peak value to a plurality of predetermined timing signatures,
(d) choose one timing signature of the plurality of predetermined timing signatures based on a comparison of the timing of occurrence of the peak value to the plurality of predetermined timing signatures, and
(e) control power to the electric heating element based on a chosen timing signature of the plurality of predetermined timing signatures.

2. The system of claim 1, wherein the controller is configured to trigger the ADC to sample in synchronization with an AC voltage of a second power line of the power lines input to the laundry machine.

3. The system of claim 2, wherein the synchronization includes starting a sampling window at a zero crossing of the AC voltage of the second power line, the sampling window having a duration of at least one period of the AC voltage of the second power line.

4. The system of claim 1, wherein the plurality of predetermined timing signatures include a 240 volt signature where a phase of the first power line and a phase of the second power line are orthogonal to each other, a 208 volt leading signature where the phase of the first power line leads the phase of the second power line, and a 208 volt lagging signature where the phase of the first power line lags the phase of the second power line.

5. The system of claim 1, wherein the controller is configured to determine the timing of occurrence of the peak value of the sampled AC voltage from the first power line by comparing one or more respective amplitudes of the sampled AC voltage to each other to determine a maximum amplitude of the sampled AC voltage, setting the maximum amplitude as the peak value and determining the timing of occurrence of the peak value based on a sampling period of the ADC.

6. The system of claim 1, wherein the controller is configured to choose the chosen timing signature of the plurality of predetermined timing signatures based on the comparison by determining that the chosen timing signature of the plurality of predetermined timing signatures matches the timing of occurrence of the peak value.

7. The system of claim 1, wherein the controller is configured to repeat steps (a) and (b) a predetermined number of times to determine an average timing of occurrence of the peak value, and perform steps (c)-(e) based on the average timing of occurrence.

8. The system of claim 1, wherein the controller is configured to use the chosen timing signature of the plurality of predetermined timing signatures to determine zero crossings of the AC voltage.

9. The system of claim 8, wherein the controller is configured to control the power to the electric heating element by synchronizing application of the AC voltage to the electric heating elements at the zero crossings of the AC voltage.

10. The system of claim 8, wherein the controller is configured to control a power switch to turn ON and OFF at the zero crossings of the AC voltage.

11. The system of claim 1, wherein step (e) comprises:
determining a desired heat power target for operating the at least one electric heating element; and
choosing a proration value for operating the at least one electric heating element based on the chosen timing signature of the plurality of predetermined timing signatures, wherein the proration value comprises a multiplier applied to a duty cycle of the at least one electric heating element.

12. The system of claim 11, wherein choosing the proration value comprises:
choosing a first proration value upon choosing a first predetermined timing signature having a first voltage value; and
choosing a second proration value upon choosing a second predetermined timing signature having a second voltage value, wherein the second voltage value is less than the first voltage value, and the second proration value is greater than the first proration value.

13. The system of claim 12, wherein:
the first voltage value is 240 volts;
the second voltage value is 208 volts; the first proration value is 1; and
the second proration value is 1.3 to 1.4.

14. The system of claim 12, wherein a chosen proration value is limited at a predetermined maximum value, and below the predetermined maximum value the chosen proration value is calculated according to the formula:

$$X = (V1^2 / V2^2)$$

where:
X = the second proration value,
V1 = a predetermined voltage value, and
V2 = the voltage value of the chosen timing signature of the plurality of predetermined timing signatures.

15. A method for operating a laundry machine comprising a drum configured to receive laundry, a motor configured to rotate the drum, at least one electric heating element configured to produce heat, an airflow path extending from the at least one electric heating element to the drum; and an analog to digital converter (ADC) configured to sample an AC voltage from a first power line of a group of power lines electrically connected to the laundry machine, and a controller, the method comprising:

(a) sampling, by the controller, an AC voltage from the first power (b) determining, by the controller, a timing of occurrence of a peak value of a sampled AC voltage from the first power line, (c) comparing, by the controller, the timing of occurrence of the peak value to a plurality of predetermined timing signatures, (d) choosing, by the controller, one timing signature of the plurality of predetermined timing signatures based on a comparison of the timing of occurrence of the peak value to the plurality of predetermined timing signatures, and (e) controlling, by the controller, power to the electric heating element based on a chosen timing signature of the plurality of predetermined timing signatures.

16. The system of claim 15, further comprising triggering, by the controller, the ADC to sample in synchronization with an AC voltage of a second power line of the power lines input to the laundry machine.

17. The system of claim 16, wherein the synchronization includes starting a sampling window at a zero crossing of the AC voltage of the second power line, the sampling window having a duration of at least one period of the AC voltage of the second power line.

18. The system of claim 15, wherein the plurality of predetermined timing signatures include a 240 volt signature where a phase of the first power line and a phase of the second power line are orthogonal to each other, a 208 volt leading signature where the phase of the first power line leads the phase of the second power line, and a 208 volt lagging signature where the phase of the first power line lags the phase of the second power line.

19. The system of claim 15, wherein determining the timing of occurrence of the peak value of the sampled AC voltage from the first power line comprises comparing one or more respective amplitudes of the sampled AC voltage to each other to determine a maximum amplitude of the sampled AC voltage, setting the maximum amplitude as the peak value and determining the timing of occurrence of the peak value based on a sampling period of the ADC.

20. The system of claim 15, wherein choosing the chosen timing signature of the plurality of predetermined timing signatures based on the comparison comprises determining that the chosen timing signature of the plurality of predetermined timing signatures matches the timing of occurrence of the peak value.

21. The system of claim 15, further comprising repeating steps (a) and (b) a predetermined number of times to determine an average timing of occurrence of the peak value, and performing steps (c)-(e) based on the average timing of occurrence.

22. The system of claim 15, further comprising using, by the controller, the chosen timing signature of the plurality of predetermined timing signatures to determine zero crossings of the AC voltage.

23. The system of claim 22, further comprising controlling, by the controller, the power to the electric heating element by synchronizing application of the AC voltage to the electric heating elements at the zero crossings of the AC voltage.

24. The system of claim 22, further comprising controlling, by the controller, a power switch to turn ON and OFF at the zero crossings of the AC voltage.

25. The system of claim 1, wherein step (e) comprises:

determining a desired heat power target for operating the at least one electric heating element; and choosing a proration value for operating the at least one electric heating element based on the chosen timing signature of the plurality of predetermined timing signatures, wherein the proration value comprises a multiplier applied to a duty cycle of the at least one electric heating element.

26. The system of claim 25, wherein choosing the proration value comprises:

choosing a first proration value upon choosing a first predetermined timing signature having a first voltage value; and choosing a second proration value upon choosing a second predetermined timing signature having a second voltage value, wherein the second voltage value is less than the first voltage value, and the second proration value is greater than the first proration value.

27. The system of claim 26, wherein:

the first voltage value is 240 volts;

the second voltage value is 208 volts;

the first proration value is 1; and the second proration value is 1.3 to 1.4.

28. The system of claim 26, wherein a chosen proration value is limited at a predetermined maximum value, and below the predetermined maximum value the chosen proration value is calculated according to the formula:

$$X = (V1^2 / V2^2)$$

where:

X=the second proration value,

V1=a predetermined voltage value, and

V2=the voltage value of the chosen timing signature of the plurality of predetermined timing signatures.

\* \* \* \* \*